US012575224B2

(12) United States Patent
Pezeshki et al.

(10) Patent No.: US 12,575,224 B2
(45) Date of Patent: \*Mar. 10, 2026

(54) P-TYPE DOPING IN GaN LEDs FOR HIGH SPEED OPERATION AT LOW CURRENT DENSITIES

(71) Applicant: AvicenaTech Corp., Sunnyvale, CA (US)

(72) Inventors: Bardia Pezeshki, Mountain View, CA (US); Cameron Danesh, Mountain View, CA (US)

(73) Assignee: AvicenaTech, Corp., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/478,503

(22) Filed: Sep. 29, 2023

(65) Prior Publication Data

US 2024/0030377 A1    Jan. 25, 2024

Related U.S. Application Data

(63) Continuation of application No. 17/542,201, filed on Dec. 3, 2021, now Pat. No. 11,810,995.

(Continued)

(51) Int. Cl.
*H04B 10/04* (2006.01)
*H04B 10/25* (2013.01)
(Continued)

(52) U.S. Cl.
CPC ........... *H10H 20/812* (2025.01); *H04B 10/25* (2013.01); *H04B 10/615* (2013.01); *H10H 20/8215* (2025.01); *H10H 20/8252* (2025.01)

(58) Field of Classification Search
CPC ...... H04B 10/40; H04B 10/25; H04B 10/502; H04B 10/112; H04B 10/1123; H04B 10/114; H04B 10/1143; H04B 10/1149; H04B 10/116; H01L 33/06; H01L 33/04; H01L 33/32; H01L 33/145; H01L 33/025; H01L 33/325
USPC ....... 398/118, 119, 127, 128, 130, 135, 136, 398/164, 172, 158, 159, 79, 43, 182, 183, 398/186, 202, 208, 138, 139; 257/13, 257/E33.008; 385/24, 124, 129
See application file for complete search history.

(56) References Cited

U.S. PATENT DOCUMENTS 7,961,990 B2 * 6/2011 Krishnamoorthy ..........................
H01L 25/0657
398/139
8,975,616 B2 * 3/2015 Wang ..................... B82Y 20/00
257/14

(Continued)

FOREIGN PATENT DOCUMENTS

KR    10-2014-0092092 A    7/2014

OTHER PUBLICATIONS

International Search Report by International Searching Authority (KIPO) in related PCT Application No. PCT/US2021/061899 dated Mar. 29, 2022.

(Continued)

*Primary Examiner* — Hanh Phan

(57) ABSTRACT

A GaN based LED, with an active region of the LED containing one or more quantum wells (QWs), with the QWs separated by higher energy barriers, with the barriers doped, may be part of an optical communications system.

3 Claims, 4 Drawing Sheets

Related U.S. Application Data

(60) Provisional application No. 63/121,091, filed on Dec. 3, 2020.

(51) Int. Cl.
| | |
|---|---|
| *H04B 10/61* | (2013.01) |
| *H10H 20/81* | (2025.01) |
| *H10H 20/812* | (2025.01) |
| *H10H 20/825* | (2025.01) |

(56) References Cited

U.S. PATENT DOCUMENTS

| | | | | |
|---|---|---|---|---|
| 10,840,408 | B1 * | 11/2020 | Yin | H01L 33/025 |
| 11,810,995 | B2 * | 11/2023 | Pezeshki | H04B 10/615 |
| 2010/0019223 | A1 * | 1/2010 | Kang | H10H 20/812 |
| | | | | 257/13 |
| 2010/0134697 | A1 | 6/2010 | Miller et al. | |
| 2012/0251045 | A1 * | 10/2012 | Budd | G02B 6/425 |
| | | | | 359/663 |
| 2018/0261716 | A1 | 9/2018 | Park | |
| 2019/0306945 | A1 | 10/2019 | Valentine | |
| 2021/0126164 | A1 * | 4/2021 | Broell | H01L 33/06 |

OTHER PUBLICATIONS

Written Opinion by International Searching Authority (KIPO) in related PCT Application No. PCT/US2021/061899 dated Mar. 29, 2022.

Extended European Search Report from the European Patent Office in related EP Application No. 21901576.5 dated Aug. 19, 2024.

W. Shi, et al., "GaN based Cyan light-emitting diodes with GHz bandwidth," 2016 IEEE Photonics Conference (IPC), p. 623-624.

Bockstaele et al., "A Parallel Optical Interconnect Link With On-Chip Optical Access", Micro-Optics, VCSELs, and Photonic Interconnects, Proceedings of SPIE, vol. 453, Photonics Europe, Apr. 26-30, 2004.

Liang et al., "Hybrid Integrated Platforms for Silicon Photonics", Materials 2010, vol. 3, pp. 1782-1802, Match 12, 2010.

Roelkens et al., "III-V/Silicon Photonics for On-chip and Inter-chip Optical Interconnects", Laser Photonics Review 4, No. 6, pp. 751-779, Jan. 11, 2010.

Rooman et al., "Asynchronous 250-Mb/s Optical Receivers with Integrated Detector in Standard CMOS Technology for Optocoupler Applications", IEEE Journal of Solid-State Circuits, vol. 35, No. 7, Jul. 2000.

Rooman et al., "High-Efficiency AlGaInP Thin-Film LEDs Using Surface-Texturing and Waferbonding with Conductive Epoxy", IEEE Photonics Technology Letters, vol. 17, No. 12, Dec. 2005.

Rooman et al., "Inter-Chip Optical Interconnects Using Imaging Fiber Bundles and Integrated CMOS Detectors", Proceedings 27th 27th European Conference on Optical Communication (ECOC), pp. 296-297, Sep. 30, 2001-Oct. 4, 2001.

Rooman et al., "Low-Power Short-Distance Optical Interconnect using Imaging Fibre Bundles and CMOS Detectors", IEEE Proceedings, 2000 Digest of the LEOS Summer Topical Meetings, Jul. 24-28, 2000.

Windisch et al., "Large-Signal-Modulation of High-Efficiency Light-Emitting Diodes for Optical Communication", IEEE Journal of Quantum electronics, vol. 36, No. 12, Dec. 2000.

Windisch et al., "Light-Extraction Mechanisms in High-Efficiency Surface-Textured Light-Emitting Diodes", IEEE Journal on selected Topics in Quantum Electronics, vol. 8, No. 2, Mar./Apr. 2002.

* cited by examiner

1

P-TYPE DOPING IN GaN LEDs FOR HIGH SPEED OPERATION AT LOW CURRENT DENSITIES

CROSS-REFERENCE TO RELATED APPLICATION(S)

This application is a continuation of U.S. patent application Ser. No. 17/542,201, filed on Dec. 3, 2021, which claims the benefit of U.S. Provisional Patent Application No. 63/121,091, filed on Dec. 3, 2020, the disclosures of all of which are incorporated by reference herein.

FIELD OF THE INVENTION

The present invention relates generally to LEDs for data communications, and more particularly to GaN based LEDs and data communications systems using high speed GaN based LEDs.

BACKGROUND OF THE INVENTION

There has been substantial interest in using high speed GaN based LEDs for data communications. One focus has been to combine data transmission with lighting ("LiFi"), where LED-based room lights would be modulated at high speed to transfer data to users in the room. Modulated LEDs incorporated on CMOS ICs can also be used to transmit data for short distance connections, ranging from intra-chip interconnects of a few mm across a large integrated circuit to rack-to-rack interconnects of 10 m or more in a datacenter. In all cases, it may be preferable to use optical sources that can be modulated at multiple gigabits-per-second, consume little power, and are reasonably efficient at generating photons. Conventionally, lasers are used as light sources for data transmission because they can be efficient and fast. However, lasers typically have a threshold current that limits the minimum power needed for each source. Thus, to get competitive power dissipation (often expressed as pico-Joules per bit) using lasers, many lower speed data lines may be multiplexed through a SERDES to increase the overall bitrate before conversion to optics; it is simply not efficient to run lasers at low bit rates. However, the SERDES adds power consumption and latency.

Using LEDs as the light source changes the situation considerably. LEDs have no fundamental threshold so better energy efficiency can be obtained compared to lasers. Furthermore, using very wide data-buses with one LED per relatively slow data line eliminates the power consumption, latency, and chip area used by SERDES.

There is a trade-off of size and light conversion efficiency for LEDs. Very small devices, on the order of microns or tens of microns tend to be faster but are less efficient. The reason for the drop in efficiency for small devices is generally believed to be surface defects on the etched edges of the devices. The smaller the diameter of an LED, the larger the edge surface to emitting area ratio, and exposed surfaces can have non-radiative defects that cause recombination without emitting photons. Thus, for lighting devices, where efficiency is paramount, are typically a few mm across to minimize the impact of edge effects.

On the other hand, carrier lifetime decreases as carrier density increases. Thus, at a given current, smaller devices are intrinsically faster because they operate at a higher current density. As a consequence, LEDs for data transmission are smaller as speed is also important.

The total carrier recombination rate in an LED is combination of trap-induced defects (Shockley-Reed-Hall or SRH recombination), radiative recombination, and Auger recombination. All these terms increase as carrier density increases. The total recombination, R, is related to the electron density in the intrinsic region, n, by:

$$R = An + Bn^2 + Cn^3 \tag{1}$$

Where A is the coefficient for non-radiative trap recombination, B is the spontaneous radiative emission, and C is the Auger recombination. Eq. (1) assumes the electron and hole densities in the intrinsic region are equal, which is reasonable because equal numbers are injected into that region.

The carrier lifetime, t, is given by:

$$1/t = A + Bn + Cn^2 \tag{2}$$

As the carrier density gets higher, the radiative and Auger recombination rates increase, shortening the carrier lifetime. The radiative efficiency of an LED depends on the ratio of the radiative recombination rate to the total recombination rate, which can be expressed as:

$$\text{Radiative efficiency} = Bn/(A + Bn + Cn^2) \tag{3}$$

The efficiency is low at very low current densities ($\sim Bn/A$), increases as n increases, reaches a maximum, and then drops as the $Cn^2$ term dominates. SRH traps are very quickly filled with carriers even at very low current densities. Since these traps are assumed to be almost always filled, trap recombination time constant is not a function of the carrier density. The radiative recombination rate, however, depends on injected carriers finding each other and increases monotonically with carrier density. At high carrier densities, the Auger process dominates, which requires that three carriers interact simultaneously. This process is non-radiative and usually results in the third carrier being injected to higher energies either in the valence or conduction band.

BRIEF SUMMARY OF THE INVENTION

Some embodiments provide an LED comprising: a p type GaN layer; an n type GaN layer; and a plurality of alternating quantum well layers and barrier layers between the p type GaN layer and the n type GaN layer, with the quantum well layers being undoped and with the barrier layers being doped, but only in a central portion of each barrier layer. In some embodiments the doping in the barrier layers is p doping. In some embodiments the doping concentration for the doping in the barrier layers is at least $10^{19}/\text{cm}^3$. In some embodiments the doping concentration for the doping in the barrier layers is at least $10^{20}/\text{cm}^3$. In some embodiments the doping in the barrier layers is with Mg. In some embodiments the p type GaN layer is doped with Mg. In some embodiments the n type GaN layer is doped with Si.

Some embodiments provide an optically interconnected processing system making use of an LED as a light source, comprising: a data source comprising a semiconductor chip with logic circuitry; LED drive circuitry coupled to the data source, the LED drive circuitry configured to generate current based on data received from the data source; an LED coupled to the LED drive circuitry so as to receive current to drive the LED to generate light encoding the data, the LED comprising a p type GaN layer, an n type GaN layer, and a plurality of alternating quantum well layers and barrier layers between the p type GaN layer and the n type GaN layer, with the quantum well layers being undoped and with the barrier layers being doped, but only in a central portion of each barrier layer; and a detector to receive light generated by the LED, the detector configured to provide an electrical signal representative of data in the received light. Some embodiments further comprise a coherent fiber bundle optically between the LED and the detector. In some embodiments the logic circuitry includes a processor. In some embodiments the drive circuitry is configured to drive the LED to generate light with a current density of 100 A/cm² or less. In some embodiments the drive circuitry is configured to drive the LED to generate light with a current density of 400 A/cm² or less.

These and other aspects and embodiments of the invention are more fully comprehended on review of this disclosure.

BRIEF DESCRIPTION OF THE FIGURES

FIG. 1a shows an example epitaxial structure for a GaN/InGaN based LED, in accordance with aspects of the invention.

FIG. 1b shows a conduction band energy diagram for the LED of FIG. 1a.

DETAILED DESCRIPTION

In some embodiments of an LED, an active region of the LED contains one or more quantum wells (QWs), with the QWs are separated by higher energy barriers. In some embodiments, the barriers are doped. In some embodiments, the barriers are p doped. In some embodiments the barriers are lightly p doped. In some embodiments, the barriers are p doped with magnesium (Mg). In some embodiments only a central portion of each doped barrier is doped, while the rest of each barrier (and QWs) are undoped.

Figures 1A, 1B:
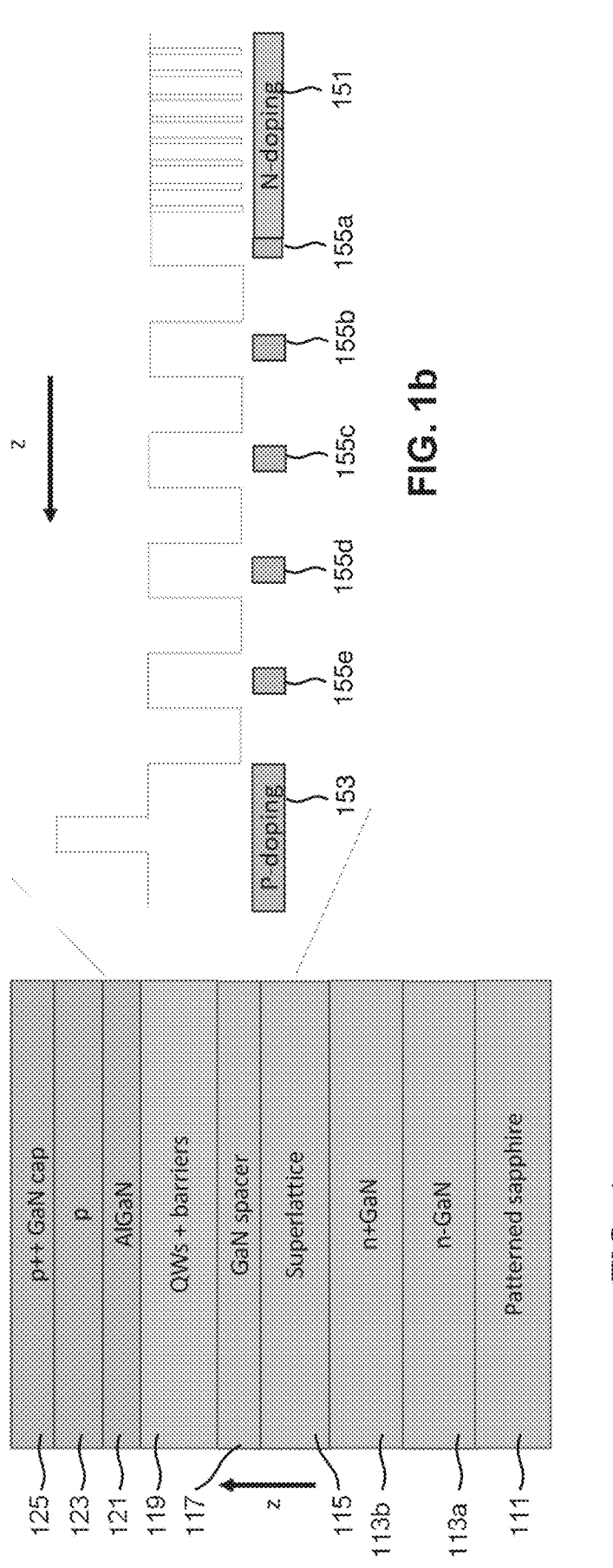

FIG. 1a shows an epitaxial structure for a GaN/InGaN based LED. In some embodiments, the structure is grown using MOCVD on a patterned sapphire substrate 111 and has a relatively thick GaN buffer 113a,b all n type and silicon doped. In some embodiments, the structure also contains a superlattice 115 to help reduce defects. The active region is comprised of one or more InGaN QWs separated by GaN barriers (together 119). In some embodiments an n-doped GaN spacer 117 is between the superlattice and the active region. In some embodiments, above the active region is an AlGaN electron barrier 121r, a thin p type region 123 and a highly doped cap GaN layer 125 for making a good electrical contact. In some embodiments, and as referenced in FIG. 1b, there are five or more QWs. In some embodiments, there are one to four QWs. In some embodiments only the central portion of each barrier is doped while the rest of each barrier (and QWs) are undoped. In some embodiments, the barriers are 10-20 nm wide. In some embodiments, the Mg doping is >10¹⁹/cm³.

In some embodiments the GaN buffer includes an n-GaN layer 113a on top of the patterned sapphire substrate, with an n+GaN layer 113b on top of the n-GaN layer. In some embodiments, the n-GaN and n+GaN layers are 2 um to 4 um thick. In some embodiments the n-GaN and n+GaN layers are each 3 um thick. The n-GaN layer and the n+GaN layer may both be silicon doped. The n+GaN layer may have higher doping for improved electrical contact, for example with the superlattice layer. The superlattice may be formed of alternating quantum wells and barriers. For instance, in some embodiments a superlattice may comprise 20-40 QWs that are approximately 1 nm-wide separated by approximately 5 nm-wide barriers, with a silicon doping in the range of $3\times10^{17}$-$3\times10^{18}$/cm³. In some embodiments a superlattice may comprise 30 QWs that are approximately 1 nm-wide separated by approximately 5 nm-wide barriers, with a silicon doping in the range of $3\times10^{18}$/cm³. In some embodiments, the GaN spacer between the superlattice and active regions may be approximately 50 nm thick with a silicon doping in the range of 10 s/cm³. In some embodiments the active region includes QWs comprised of some percentage of Indium, for instance 10%-15% Indium. In some embodiments, the width of the QWs is in the range of 2 nm-4 nm. In some embodiments, the width of the QWs is 3 nm. In some embodiments the barriers are in the range of 10 nm-20 nm thick. In some embodiments the barriers are 14.8 nm thick. In some embodiments doping of the barriers is in the range of $10^{19}$/cm³. In some embodiments the interfaces of the barrier are undoped or intrinsic. In some embodiments the AlGaN electron barrier has a thickness of 20 nm-40 nm. In some embodiments the AlGaN electron barrier is doped with Mg, with a doping for example of $3\times10^{19}$-$3\times10^{20}$/cm³. In some embodiments the thin p type region is 50 nm-150 nm thick, with doping of $3\times10^{9}$-$3\times10^{20}$/cm³, for example of Mg. The highly doped cap GaN layer may have a thickness of 3 nm-8 nm with p++ doping, which may be very high Mg doping.

FIG. 1b shows a conduction band energy diagram for the LED of FIG. 1a. Radiative efficiency and speed are maximized when hole-electron pairs recombine in the QWs. The example of FIG. 1b assumes the LED includes 5 QWs, separated by barriers. The diagram additionally shows n doping 151 in an n region of the LED, p doping 153 in a p region of the LED, and p doping 155a-e of the five barriers.

If the active region is p doped resulting in an equilibrium hole density of $p_0$ and injected hole and electron concentrations of p and n, Equation (2) now becomes:

$$1/t = A + B(p_0+p) + C_{e-e-h}n(p_0+p) + C_{h-h-e}(p_0+p)^2 \qquad (4)$$

Where $C_{e-e-h}$ is the Auger coefficient for two electrons and a hole interacting, resulting in one of the electrons being energized high into the conduction band and $C_{h-h-e}$ is the Auger coefficient for two holes and an electron interacting to send one of the holes deep into the valence band. Comparing Eq. (4) to Eq. (2), when n and p are much less than $p_0$ (i.e. at low drive current densities), the effect of active region doping is that the radiative second term is substantially increased and that the overall lifetime t is decreased relative to an undoped active region.

A second advantage of doping the active region, especially if the doping is p type, is that it is believed that doing so helps with carrier transport problems. As previously mentioned, the electrons have much higher mobility than the holes. At high current densities, this may cause problems with getting enough holes in the active region, and which in turn causes electron overflow from the QWs and a decrease in radiative efficiency. Doping p type active region doping provides a ready supply of holes and helps deplete the electrons, slowing overflow.

However, there is a drawback to doping the active region p type: the normal p type dopants like Mg also act as non-radiative recombination centers, increasing A in the above equation (4), and reducing quantum efficiency. Thus, p doping the quantum well active region is undesirable in applications requiring very high radiative efficiency such as lighting. However, in communications applications where modulation speed is very important and some radiative efficiency reduction can be tolerated, p doping the active region may provide attractive benefits.

As mentioned above, in some embodiments, within the active region only the barriers between the QWs are p doped, for instance with Mg. This spatially separates the Mg acceptors from the carriers in the QWs, which reduces the interaction between the carriers and the dopants. Furthermore, this increases the percentage of Mg-doped sites that are "activated", e.g. that act as acceptors and contribute to the hole density. This increased activation for acceptors in barriers relative to wells is due to increased energy loss associated with ionization of the acceptors in wells, since the hole can fall into the well. In bulk GaN, Mg activation is low, with only about 1% of the dopant sites generating holes. This activation, however, is much higher when the Mg is placed in the barriers adjacent to QWs. To further separate the Mg acceptors from the carriers in the QWs, in some embodiments only the central portion of each barrier is doped while the rest of the barriers (and QWs) are undoped. In some embodiments, the barriers are 5-10 nm wide. In some embodiments, the barriers are 10-15 nm wide.

Figure 2:
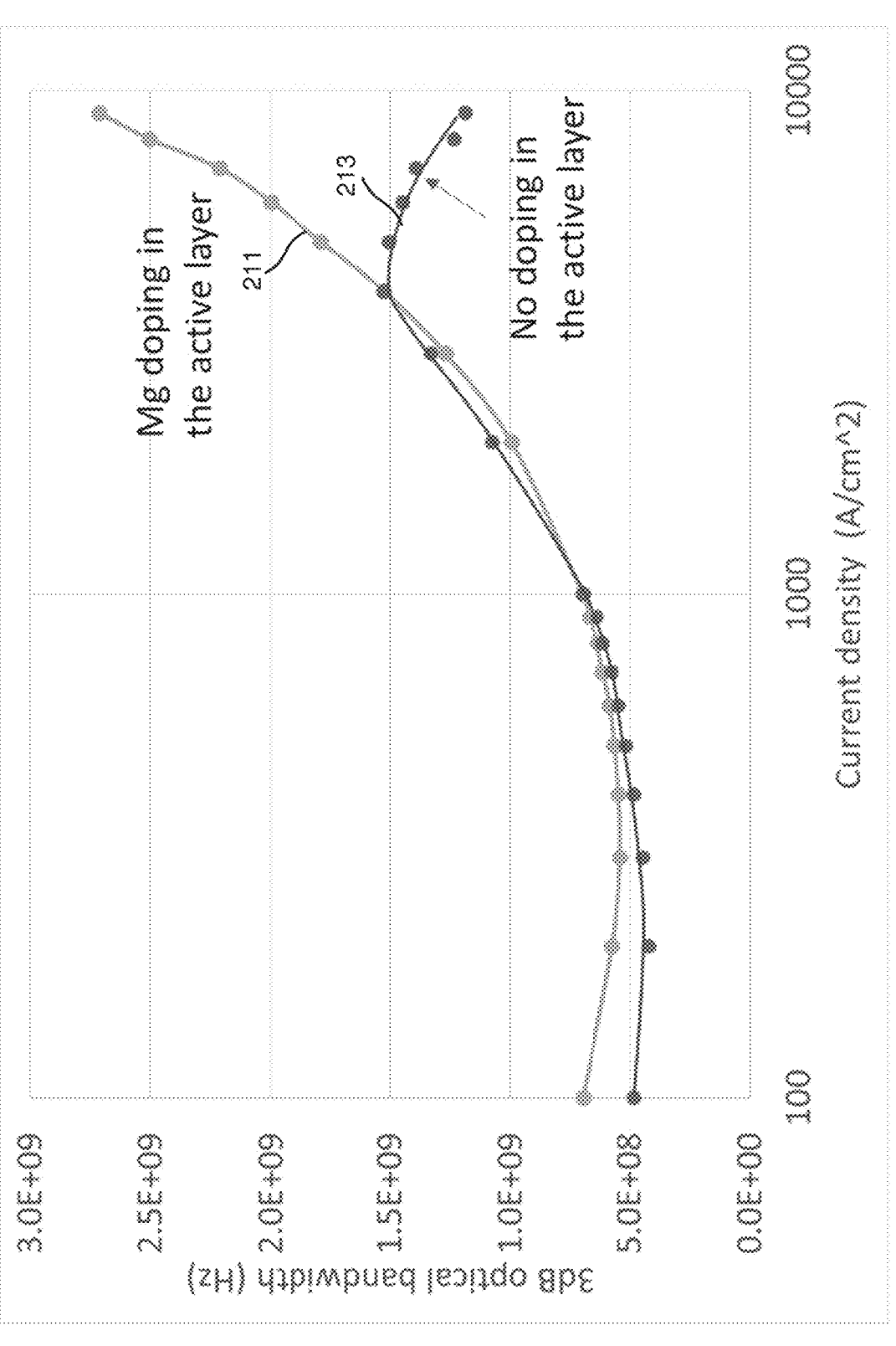
FIG. 2 graphs measured 3 dB optical bandwidth versus current density for the structure of FIG. 1a and for a standard LED with no doping in the active regions.

FIG. 2 graphs the measured 3 dB optical bandwidth versus current density between 100 A/cm$^2$ and 10000 A/cm$^2$ for the structure of FIG. 1a (211) and for a standard LED with no doping in the active regions (213). Below 1000 A/cm$^2$ the 3 dB optical bandwidth of the structure of FIG. 1a is greater than that of the standard structure, with the difference in 3 dB optical bandwidth increasing until 100 A/cm$^2$. At 100 A/cm$^2$, the lower bound for current density in the graph of FIG. 2, the 3 dB optical bandwidth of the structure of FIG. 1a is approximately 40% greater than that of the standard structure. At higher current densities, for example over about 4000 A/cm$^2$, the 3 dB optical bandwidth of the standard structure starts to roll over and decrease, while the 3 dB bandwidth of the structure of FIG. 1a continues to increase. The roll over in 3 dB optical bandwidth for the standard LED is presumably due to poor injection of holes into the active region and electron overflow out of the active region.

Figure 3:
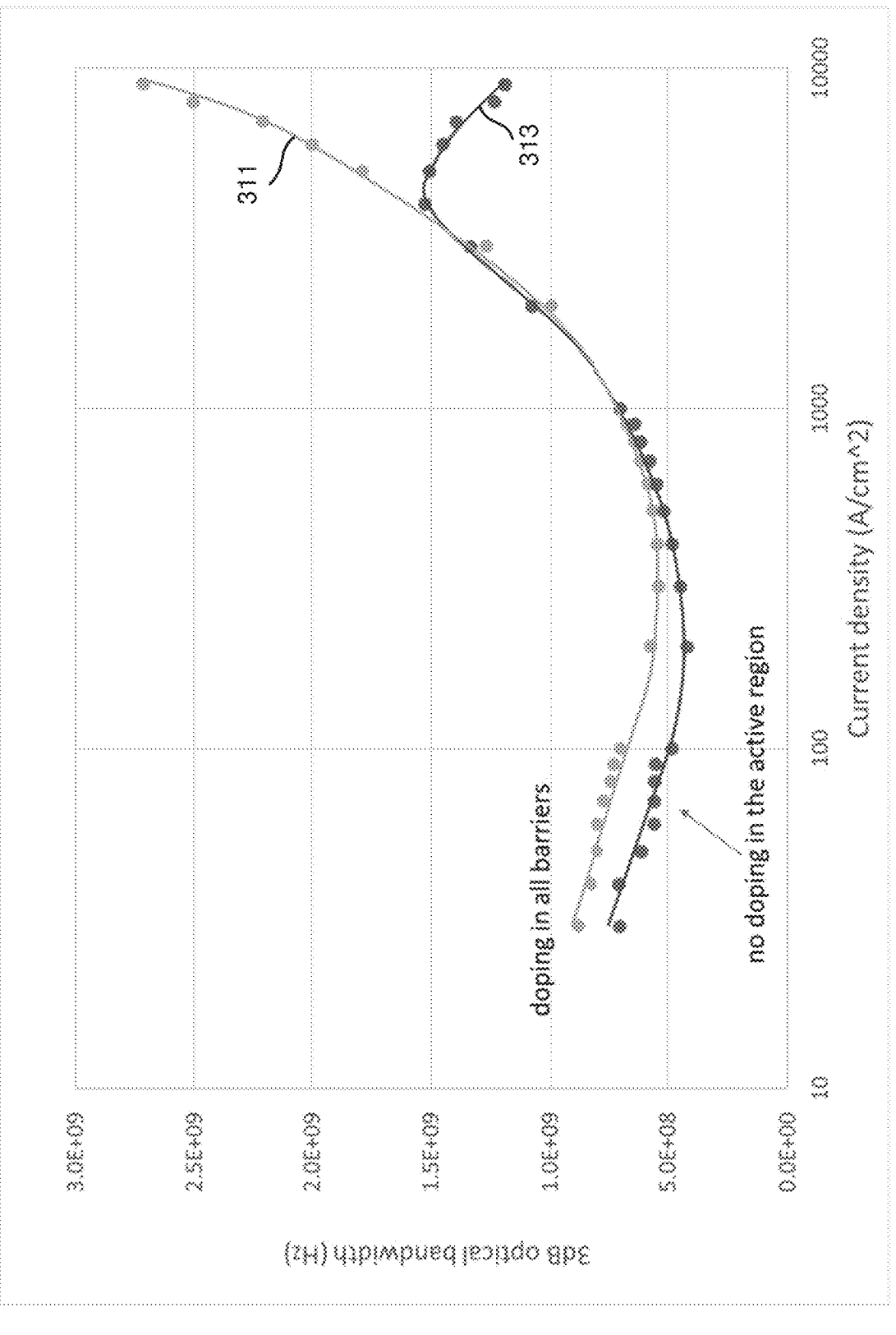
FIG. 3 further graphs the measured 3 dB optical bandwidth versus current density for the structure of FIG. 1a and for a standard LED with no doping in the active region.

FIG. 3 graphs the measured 3 dB optical bandwidth versus current density between about 30 A/cm$^2$ and 10000 A/cm$^2$ for the structure of FIG. 1a (311) and for a standard LED with no doping in the active regions (313). The graph of FIG. 3 is similar to that of FIG. 2, with the graph of FIG. 3 further including data with current density in the range of 30 A/cm$^2$ to 100 A/cm$^2$. As shown in FIG. 3, as current density decreases below 100 A/cm$^2$, the 3 dB optical bandwidth of both the structure of FIG. 1a and the standard structure increase at about the same rate. As the 3 dB optical bandwidth of the structure of FIG. 1a is approximately 40% greater than that of the standard structure at 100 A/cm$^2$, however, the structure of FIG. 1a exhibits significantly greater 3 dB optical bandwidth at those generally lower current densities.

In some embodiments an LED is part of an optical communication or processing system. In some embodiments the optical communication system provides for communication of data between semiconductor chips or portions of semiconductor chips. In some embodiments the optical processing system provides for time of flight information for light generated by the LED. In some embodiments the LED includes a p region, and n region, and an active region between the p-region and the n-region, the active region including a plurality of quantum well layers separated by barrier layers, some of which are doped and some of which are not doped. In some embodiments the doping for the barrier layers is p doping. In some embodiments the p doping is with Mg. In some embodiments the LED is as discussed elsewhere herein, including as shown or described in the figures, which are expressly made part of this disclosure.

Figure 4:
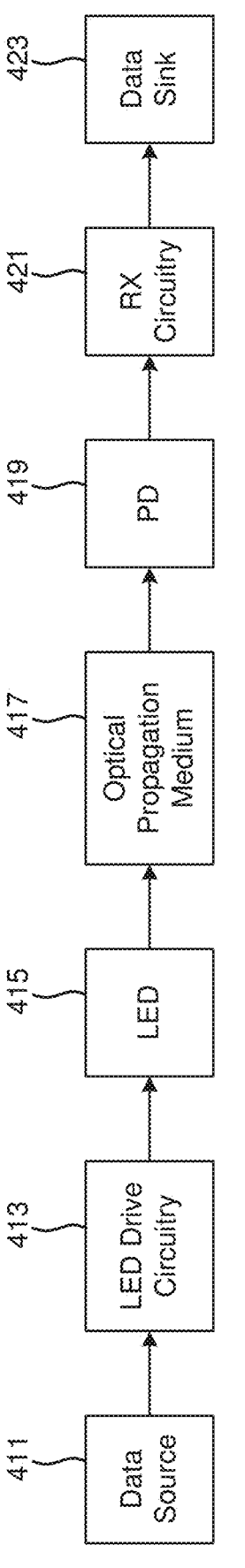
FIG. 4 is a block diagram of an optical communication or processing system making use of a GaN based LED as a light source, in accordance with aspects of the invention.

FIG. 4 is a block diagram of an optical communication or processing system making use of an LED as a light source, in accordance with aspects of the invention. In some embodiments the LED is as variously discussed herein. In FIG. 4, a data source 411 provides data. The data source may be, for example, a semiconductor chip with logic circuitry. The logic circuitry may perform various operations on or with data, and the logic circuitry may include or comprise a processor. The data source provides the data to LED drive circuitry 413. The LED drive circuitry activates an LED to generate light encoding the data. In some embodiments the LED drive circuitry activates the LED 415 with a drive current density of greater than 400 A/cm$^2$. In some embodiments the LED drive circuitry activates the LED 415 with a drive current density of 400 A/cm$^2$ or less. In some embodiments the LED drive circuitry activates the LED with a drive current density of 100 A/cm$^2$ or less. In some embodiments the LED drive circuitry activates the LED with current expected to drive the LED with a current density of 80 Amps/cm$^2$ or less. In some embodiments the LED drive circuitry activates the LED with drive current expected to drive the LED with a current density of 60 Amps/cm$^2$ or less. In various such of these embodiments the LED drive circuitry activates the LED with a drive current density of 30 A/cm$^2$ or greater. In various of these embodiments the LED drive circuitry activates the LED at a data rate of 1 Gb/s or greater. In various of these embodiments the LED drive circuitry activates the LED at a data rate of 1.5 Gb/s or greater. In various of these embodiments the LED drive circuitry activates the LED at a data rate of 2.0 Gb/s or greater. In various of these embodiments the LED drive circuitry activates the LED at a data rate of 3.0 Gb/s or greater.

In some embodiments the LED has a 3 dB optical bandwidth for the current and modulation frequency applied by the LED drive circuitry at the modulation frequency.

The light generated by the LED is provided to an optical propagation medium 417. In some embodiments the light is first provided to an optical coupler (not shown in FIG. 4), which passes the light into an optical propagation medium 417. In some embodiments the optical propagation medium is a waveguide. In some embodiments the optical propagation medium is a coherent fiber bundle. In some embodiments the optical propagation medium is free space. The optical propagation medium may be used in transferring the light from one area of a semiconductor chip serving as the data source to another area of the semiconductor in some embodiments. In other embodiments, the optical propagation medium may be used in transferring light from the semiconductor chip to another semiconductor chip, for example another chip including logic circuitry, a memory chip, or other module, for example in a multi-chip module.

The optical propagation medium transfers the light to a detector 419, for example a photodiode, for optical-electrical conversion. In some embodiments the light from the optical propagation medium may first be provided to a further optical coupler, which passes the light to the detector. The detector provides an electrical signal representative of data in the received light to receiver circuitry 421. The receiver circuitry may include, for example, amplification circuitry, for example a transimpedance amplifier, to amplify the signal from the detector and sampling or gating circuitry in providing data of the signal to a data sink 423. In some embodiments the receiver circuitry does not include deserialization circuitry. In some embodiments the data sink may be the same semiconductor chip as providing the data source. In some embodiments the data sink may be a receiver for a time-of-flight device. In some embodiments the data sink may be another chip including logic circuitry, a memory chip, or other module, for example in a multi-chip module.

Although the invention has been discussed with respect to various embodiments, it should be recognized that the invention comprises the novel and non-obvious claims supported by this disclosure.

What is claimed is:

1. An optical processing system making use of an LED as a light source, comprising:

a data source comprising a semiconductor chip with logic circuitry;

LED drive circuitry coupled to the data source, the LED drive circuitry configured to generate current based on data received from the data source;

an LED coupled to the LED drive circuitry so as to receive current to drive the LED to generate light encoding the data, the LED comprising a p type GaN layer, an n type GaN layer, and a plurality of alternating quantum well layers and barrier layers making up an active region of the LED between the p type GaN layer and the n type GaN layer, with the quantum well layers being undoped and with only barrier layers that are between the quantum well layers in the active region being p-doped by a p-doping concentration of at least $10^{19}/cm^3$; and a detector to receive light generated by the LED, the detector configured to provide an electrical signal representative of data in the received light;

wherein the drive circuitry is configured to drive the LED to generate light with a current density of greater than 4000 A/cm$^2$.

2. The optical processing system of claim 1, further comprising a coherent fiber bundle optically between the LED and the detector.

3. The optical processing system of claim 1, wherein the logic circuitry includes a processor.

\* \* \* \* \*